(12) United States Patent
Schörner et al.

(10) Patent No.: US 10,123,440 B2
(45) Date of Patent: Nov. 6, 2018

(54) ELECTRICAL DEVICE HAVING A HOUSING AND A LID WHICH MAY BE PLACED ON THE HOUSING

(71) Applicant: SEW-EURODRIVE GMBH & CO. KG, Bruchsal (DE)

(72) Inventors: Martin Schörner, Bruchsal (DE); Josef Schmidt, Graben-Neudorf (DE); Martin Huber, Bühlertal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

(21) Appl. No.: 14/776,238

(22) PCT Filed: Feb. 14, 2014

(86) PCT No.: PCT/EP2014/000403
§ 371 (c)(1),
(2) Date: Sep. 14, 2015

(87) PCT Pub. No.: WO2014/139626
PCT Pub. Date: Sep. 18, 2014

(65) Prior Publication Data
US 2016/0044813 A1     Feb. 11, 2016

(30) Foreign Application Priority Data
Mar. 12, 2013   (DE) .......................... 10 2013 004 189

(51) Int. Cl.
*H05K 5/06*   (2006.01)
*H05K 5/02*   (2006.01)
(Continued)

(52) U.S. Cl.
CPC ........... *H05K 5/061* (2013.01); *H05K 5/0247* (2013.01); *H05K 5/03* (2013.01); *H05K 5/04* (2013.01)

(58) Field of Classification Search
CPC ............ H05K 5/061; H05K 5/04; H05K 5/03; H05K 5/0247; H05K 5/06; H05K 5/0095;
(Continued)

(56) References Cited

U.S. PATENT DOCUMENTS 4,512,619 A * 4/1985 Dechelette ............. H01R 9/053
439/276
5,851,124 A * 12/1998 Young .................. H01R 4/5033
174/84 C
(Continued)

FOREIGN PATENT DOCUMENTS

CN   101471498 A   7/2009
CN   202145599 U   2/2012
(Continued)

OTHER PUBLICATIONS

International Preliminary Report on Patentability, dated Sep. 24, 2015, issued in corresponding International Application No. PCT/EP2014/000403.
(Continued)

*Primary Examiner* — Steven T Sawyer
*Assistant Examiner* — Sagar Shrestha
(74) *Attorney, Agent, or Firm* — Hunton Andrews Kurth LLP

(57) ABSTRACT

An electrical device having a housing and a lid which may be placed on the housing. A sealing element is situated in a depression of the housing, in particular the wall of the housing, which is disposed between the housing and the lid. The sealing element has a recess for the feed-through of a cable. The cable is inserted into a curved groove of the housing, especially the wall of the housing. The housing has a claw segment, which hooks and/or cuts into into the shielding of the cable.

17 Claims, 11 Drawing Sheets

(51) Int. Cl.
*H05K 5/03* (2006.01)
*H05K 5/04* (2006.01)

(58) Field of Classification Search
CPC .... H05K 9/0015; H01G 2/103; H01L 23/055; H01L 23/045; H01L 23/02; H01L 23/10
USPC ................ 174/50.5, 50.6; 361/800, 807, 816
See application file for complete search history.

(56) References Cited

U.S. PATENT DOCUMENTS

| | | | | |
|---|---|---|---|---|
| 6,351,365 | B1* | 2/2002 | Gilcrease | H01R 13/701 361/115 |
| 6,568,952 | B1* | 5/2003 | Tomasino | H01R 4/5033 439/411 |
| 2005/0042920 | A1* | 2/2005 | Poiraud | H01R 9/053 439/582 |
| 2005/0130484 | A1* | 6/2005 | Morishita | H01R 9/053 439/394 |
| 2007/0007038 | A1* | 1/2007 | Cox | H02G 3/088 174/650 |
| 2007/0215614 | A1* | 9/2007 | Matsui | H05K 5/0069 220/3.2 |
| 2008/0083547 | A1* | 4/2008 | Pinol Pedret | H02G 3/088 174/50 |
| 2008/0246232 | A1* | 10/2008 | Takahashi | F16J 15/122 277/651 |
| 2009/0149048 | A1* | 6/2009 | Pavlovic | B60L 3/0069 439/181 |
| 2009/0280688 | A1* | 11/2009 | Kawada | H01Q 1/1271 439/620.01 |
| 2010/0025126 | A1* | 2/2010 | Nakatsu | B60L 11/00 180/65.1 |
| 2010/0108375 | A1* | 5/2010 | Richter | H01R 13/5202 174/520 |
| 2011/0226526 | A1* | 9/2011 | Chu | H02G 3/088 174/659 |
| 2013/0074986 | A1 | 3/2013 | Larsson et al. | |
| 2013/0076269 | A1* | 3/2013 | Shilton | F21L 4/08 315/360 |
| 2013/0081849 | A1* | 4/2013 | Simmons | H01R 9/223 174/50.5 |
| 2013/0229097 | A1* | 9/2013 | Tamai | H05K 5/0247 312/223.6 |
| 2013/0286597 | A1* | 10/2013 | Zhang | H05K 5/0056 361/720 |
| 2014/0182928 | A1* | 7/2014 | Starke | H02G 3/22 174/559 |
| 2014/0197656 | A1* | 7/2014 | Ochiai | B62K 19/30 296/37.1 |
| 2014/0252722 | A1* | 9/2014 | Takao | F16J 15/062 277/590 |
| 2016/0372860 | A1* | 12/2016 | D'Addario | H01R 13/5845 |

FOREIGN PATENT DOCUMENTS

| | | | | |
|---|---|---|---|---|
| CN | 102844950 A | 12/2012 | | |
| DE | 296 06 194 | 6/1996 | | |
| EP | 2 023 466 | 2/2009 | | |
| JP | 06-66081 | 9/1994 | | |
| JP | 2001-201640 | 7/2001 | | |
| JP | 2006129545 | * | 5/2006 | ............... H02G 3/22 |
| WO | 2006/016464 | 2/2006 | | |
| WO | 2006/056512 | 6/2006 | | |

OTHER PUBLICATIONS

International Search Report, dated Sep. 11, 2014, issued in corresponding International Application No. PCT/EP2014/000403.

* cited by examiner

ELECTRICAL DEVICE HAVING A HOUSING AND A LID WHICH MAY BE PLACED ON THE HOUSING

FIELD OF THE INVENTION

The present invention relates to an electrical device having a housing and a lid that may be placed on top of the housing.

BACKGROUND INFORMATION

It is generally known that cables can be guided through screw-type conduit fittings, which are meant to be inserted into machined surface sections of a cast metal housing in order to allow sealing to take place.

SUMMARY

Therefore, the present invention is based on the objective of further developing an electrical device which includes a housing and is able to be produced in the most cost-effective and uncomplicated manner possible.

Features of the present invention in the electrical device include the housing and a lid which is able to be placed on the housing are that a sealing element is disposed in a depression of the housing, especially in the wall of the housing, which is situated between the housing and the lid, the sealing element having a recess for the feed-through of a cable, the cable being inserted into a curved groove of the housing, especially of the wall of the housing, the housing having a claw segment, which hooks and/or cuts into the shielding of the cable.

This has the advantage that the electrical connection to the housing is already established by simply inserting the cable into the groove and that excellent grounding is thereby achievable as well.

In addition, the housing is able to be produced as a cast metal housing, and no machining of the respective surface sections of the housing on which the sealing element touches the housing is necessary in order to produce the tightness. For the sealing element is made from elastic material in such a way that the material of the sealing element comes to lie against the surface sections when the lid exerts pressure on the sealing element and provides sealing as a result, so that a high type of protection is achievable.

In one advantageous development, the housing including the claw section is made of metal, especially aluminum. This has the advantage that the cuttability is very effective, that is to say, cutting of sufficient depth is achievable by the sharp-edged claw sections without exerting great force.

In one advantageous development, a seal, especially a flat seal, is disposed between the lid and the housing, which in particular is extruded onto the lid, and when the lid is in place, the seal in particular is sectionally pressed against the housing and against the sealing element in another section, in particular in such a way that the sealing element is pressed into the depression. This offers the advantage that a high type of protection is attainable. In addition, the lid presses the sealing element into the depression, which means that outstanding seal tightness is able to be produced.

In one advantageous development, the sealing element, in particular a leg segment of the sealing element, includes a recess, through which the cable is threaded, a sealing lip, in particular a circumferential sealing lip, of the sealing element is resting against the cable. This offers the advantage that a high type of protection is attainable and the production is uncomplicated in addition. Especially when the sealing element is produced from an elastomer, a high type of protection, in particular IP54 or higher, can be obtained in that the material of the sealing element is resting tightly against the housing.

With the aid of the lid placed on the housing, the sealing element is squeezed between the lid and the housing, and the cable, which is routed through the recess of the sealing element, is thereby connected even more tightly.

In one advantageous development, the curved groove extends in S-form, which advantageously makes it possible to achieve traction relief. In response to tensile loading, the cable is clamped inside the groove, and the claw sections cut into the shielding of the cable, so that electrical contacting is able to be established. The lid placed on the housing together with the curved groove thus delimits the cable, which therefore has to stay inside the groove.

In one especially advantageous development, a groove is developed in the housing, transversely to the cable direction, and in particular a lateral groove is developed in the housing transversely to the groove direction and transversely to the cable direction, the sealing element projects into the groove and/or the lateral groove and thus is delimited in the cable direction and counter to the cable direction, and/or is retained in the housing, which is advantageous insofar as the sealing element is held securely inside the housing. The groove extending transversely to the cable direction, i.e., the transverse groove, and the lateral groove fix the sealing element in position inside the housing.

In one advantageous development, the sealing element, in particular another leg segment of the sealing element, includes a further recess, through which an additional cable is fed, a sealing lip, in particular a circumferential sealing lip, of the sealing element rests against the further cable, the cable in particular is inserted into a curved groove of the housing, especially of the wall of the housing, the housing in particular includes a claw section, which claws and/or cuts into the shielding of the cable, the sealing element in particular includes a yoke section, which interconnects the leg sections. This has the advantage that multiple cables are able to be supplied and connected with a high type of protection, and in response to tensile loading of the cable, the cable can be clamped inside the curved groove of the housing and be contacted with an individual claw section.

In one advantageous development, the cable has an electric line surrounded by an insulating material, which is enveloped by shielding, in particular a sheath of an electrically insulating material surrounds the shielding in the region of the sealing lip of the sealing element, the cable in particular is stripped of its sheath in the region of the claw sections. This has the advantage that the cable is easy to manufacture and the electrical contacting is able to be established in an uncomplicated manner.

In one advantageous development, the inner diameter of the groove in the region of the claw section is smaller than the outer diameter of the sheath-stripped cable. This has the advantage that an electrical connection is easily achievable in that the claw section cuts into the shielding.

In one advantageous development, the electrical device is provided with a housing, a fan module is accommodated in a depression of the housing and connected to the housing by a snap-on connection, the fan module includes a support element to which a fan is connected by a snap-on connection, a circuit board fitted with electronic components is accommodated by the support element, in particular in an indented region or receiving region formed by a circumferential wall section of the support element, a sealing cap is connected to the support element, in particular plugged onto and over the circumferential wall section, the fitted circuit board is situated in the space surrounded by the sealing cap, in particular the sealing cap made of rubber or some other elastomer, and by the support element, in particular the support element produced as a plastic extrusion component.

This has the advantage that the fan module is connected to the metallic housing by a snap-on connection. It is therefore easy to exchange the fan module or to separate it when disposing of the electrical device. The electronic circuit controlling and/or supplying the fan is able to be placed between the sealing cap and support element in a protected manner. The fan, as well, is easily connectable or disconnectable.

In one advantageous development, the sealing cap has an annular collar section, which rests against a tubular section developed on the housing, the tubular section surrounding a recess that runs through the housing, in particular through the wall of the housing. This has the advantage that a supply line is able to be routed from the circuit board to the interior of the housing through an uninterrupted recess, the through-feed being sealed.

In one advantageous development, centering pin sections are developed on the support element, which may be used for positioning the fan, a detent is developed on the support element, by which the fan is connected to the support element by a snap-on connection, recesses are situated on the support element, through which the airflow aspirated by the fan is able to be conducted, the fan is disposed on the side of the support element that faces the housing. This is advantageous insofar as the support element may be formed in one piece with the detents, the centering sections as well as the wall section encircling the circuit board. A simple manufacture is achievable as a result and the materials are easily separable when disposing of the electrical device.

In one advantageous development, the circuit board is fitted with an electronic circuit which supplies the fan, the supply line of which is fed through a recess surrounded by the annular collar section, in particular through the recess leading into the interior of the housing and surrounded by the tubular section. This is advantageous insofar as the supply line into the interior is able to be developed in a sealed manner.

In one advantageous development, the housing has recesses through which the airflow supplied by the fan emerges, the recesses in particular being disposed on a step developed on the housing, so that the emerging airflow streams along cooling fins developed on the housing, the cooling fins at least regionally extending in parallel form, in particular. This is advantageous since it allows better cooling of the housing.

In one advantageous development, a bearing section on which the circuit board sits is developed on the support element, and/or a clamp-down section is developed on the sealing cap, which presses the circuit board against the support element, in particular against a bearing section of the support element. This advantageously fixes the circuit board in position, the clamp-down section being situated on the inner side of the sealing cap.

In one advantageous development, the support element is connected to the housing at the edge region of the depression of the housing in a sealed manner, in particular in an airtight manner or in a manner that is tight with respect to over-pressure. This is advantageous insofar as the overpressure generated by the fan in the output-side spatial region, viewed from the direction of the fan, drives an airflow exclusively through the recesses in the housing, so that the emerging airflow can be guided along the cooling fins of the housing and the cooling is improved as a result.

Further advantages are derived from the dependent claims. The present invention is not restricted to the feature combination of the claims. Those skilled in the art will discover additional meaningful possibilities for combining the claims and/or individual claim features and/or features of the specification and/or of the figures, that arise from the stated objective and/or the objective resulting from a comparison with the related art, in particular.

DETAILED DESCRIPTION

Figure 1:
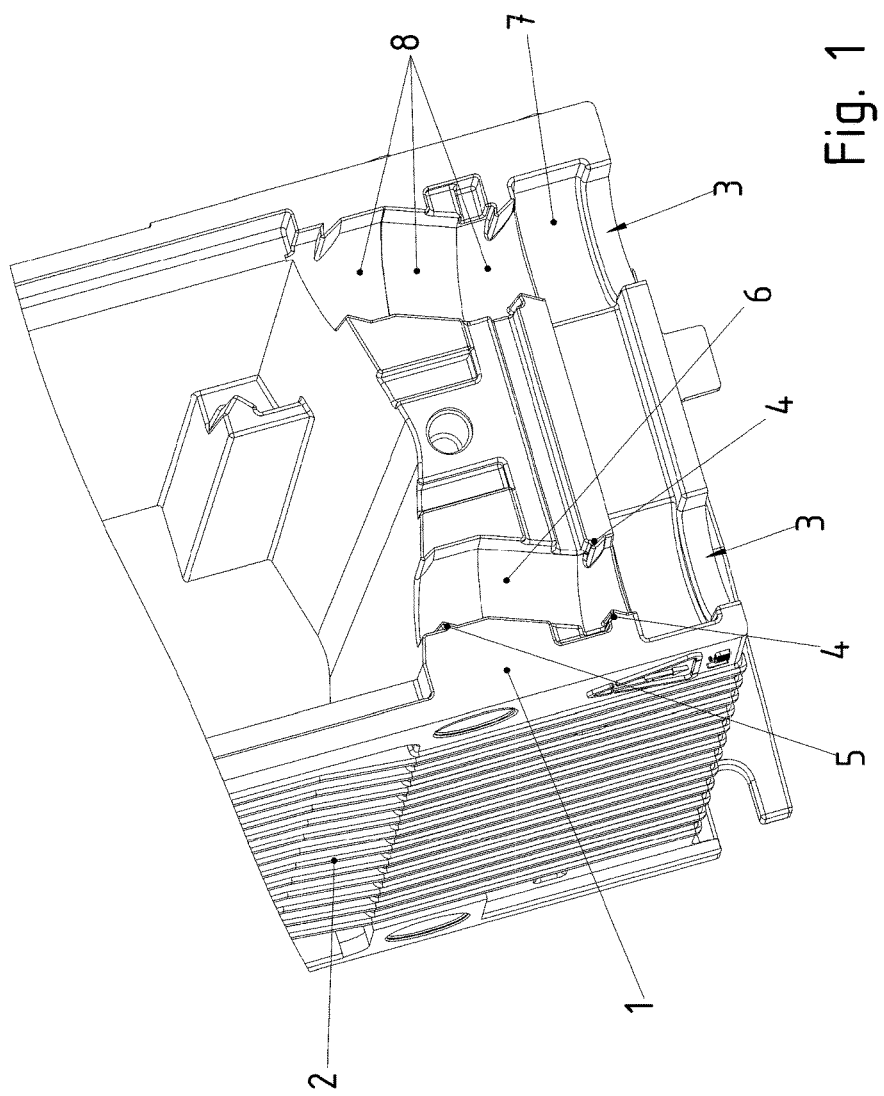
FIG. 1 shows an oblique view of a housing 1 of an electrical device according to the present invention, especially a converter, provided with a sealing element 7, the lid of the device having been removed.
Figure 2:
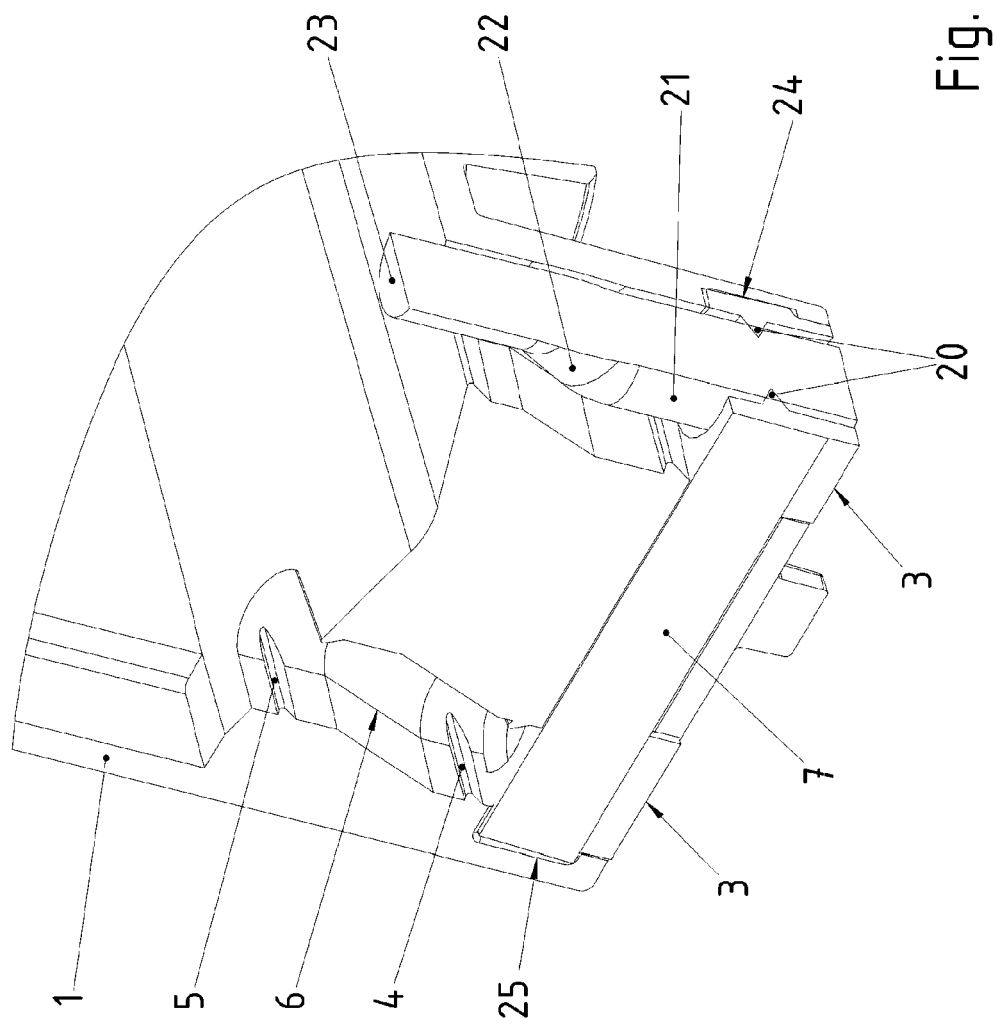
FIG. 2 shows the cable insertion region of the device in a cut and an oblique view, where a cable 8 is provided in one of the curved uninterrupted grooves 6 introduced into the wall of housing 1.
Figure 3:
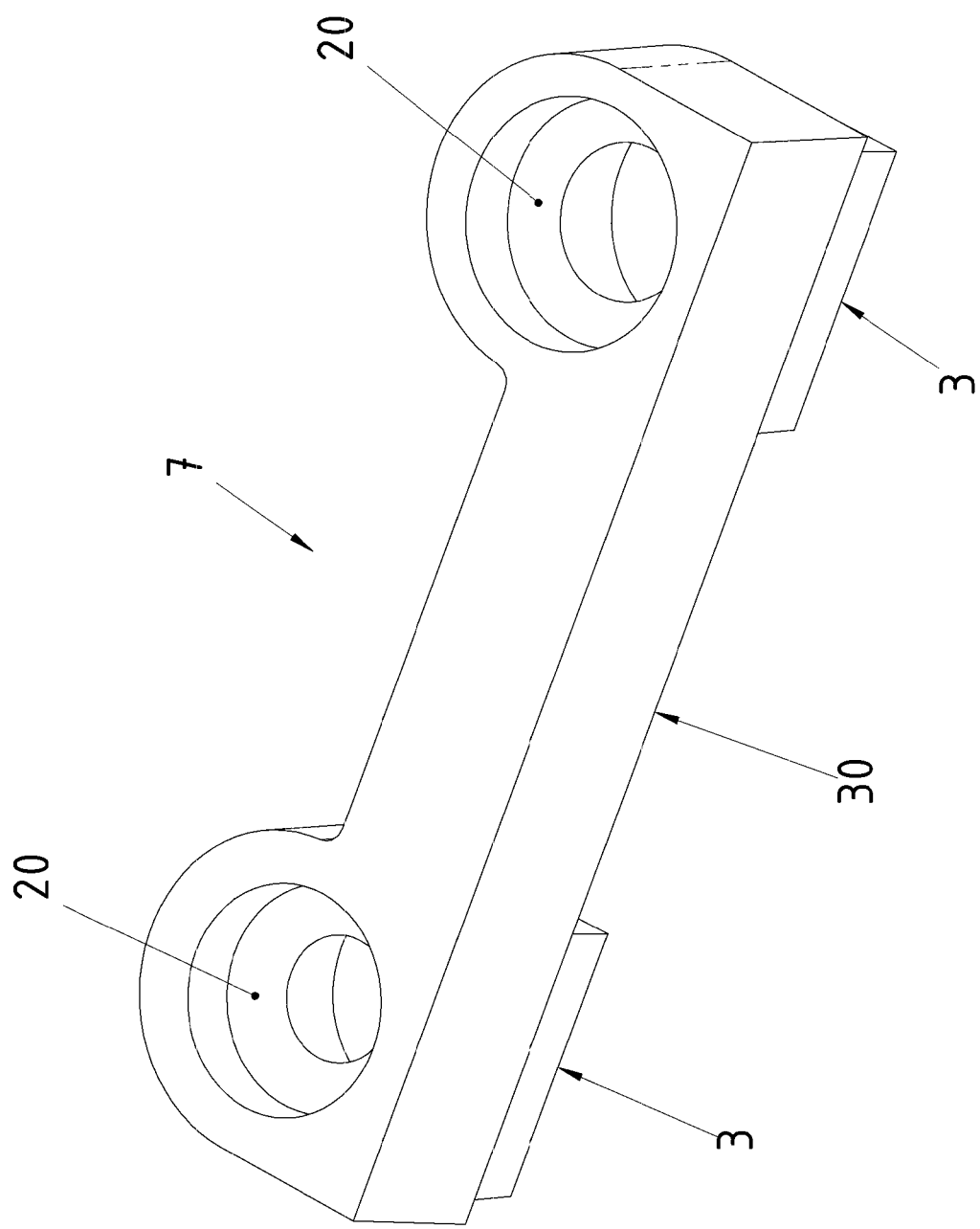
FIG. 3 shows sealing element 7 in an oblique view.

As illustrated in FIG. 1, the lid of the device is able to be placed on top of housing 1, in particular an aluminum housing, of the electrical device; the lid may be developed as a plastic injection molding part, and a circumferential flat seal is provided on the lid in the contact region between housing 1 and the lid. When the lid is placed on housing 1, the lid is therefore pressed against the housing with its flat seal and provides sealing in this manner.

In the process the seal also exerts pressure on a sealing element 7, which is inserted into a depression of housing 1.

Sealing element 7 has two cable bushings. Each cable bushing is situated in a leg segment 3, and leg segments 3 are connected with the aid of a yoke section. Each leg segment 3 has an uninterrupted recess through which a cable 8 can be fed. A sealing lip 20 which surrounds the recess exerts pressure on cable 8 and thereby seals the cable with respect to sealing element 7.

A groove 24, into which leg segment 3 of sealing element 7 can be inserted and which extends transversely to the cable direction, is situated at the bottom of the recess in housing 1. Housing 1 also has a lateral groove 25, which runs transversely to groove 24 and transversely to the cable direction and is likewise introduced into or formed on the wall of housing 1. The lateral end section of sealing element 7 extends into this lateral groove 25. As a result, sealing element 7 is fixed in position with the aid of the grooves (24, 25) and unable to slip out of the depression of the housing, in particular the housing wall, in the cable direction.

The cable has a line, in particular an inner conductor, which preferably is made of copper and hereinafter will also be referred to as core 23. This line is surrounded by insulation material 22, i.e., an electrically insulating material, which in turn is surrounded by metallic shielding 21. Shielding 21 is preferably implemented as a metal mesh. On its external surface, cable 8 is provided with a sheath made from an electrically insulating material.

The housing has cooling fins 2 for better heat dissipation of power components that are connected to the housing in a heat-conducting manner.

The lid is made of plastic. Disposed on its inner side is a circuit board including signal electronics, which functions as controller of the power components.

Cable 8 fed through the recess in sealing element 7 is inserted into a groove which essentially extends in the cable direction and has a curved shape, in particular an S-shape or a meander shape. The groove is situated in the housing wall. On the one hand, the curved shape provides tensile relief since increased friction is generated, and on the other hand, sharp-edged claw sections (4, 5) are developed on the groove wall, which cut into the shielding 21 of cable 8. The cable is preferably stripped of its sheath in the region of the groove. In the area of the recess of the sealing element, on the other hand, cable 8 preferably includes its sheath, so that sealing lip 20 rests tightly against the sheath of cable 8.

Before cable 8 is placed inside the groove, the diameter of the sheath-stripped cable in the region of the claw sections (4, 5) is slightly larger than the inner diameter of the groove. As a result, the individual claw section (4, 5) already claws into shielding 21 when the cable is inserted, so that a simple electrical connection between the housing and shielding 21 is achieved. Housing 1 and/or shielding 21 are/is preferably electrically connected to ground, i.e., grounded, in this manner.

Sealing element 7 is preferably made of rubber or plastic that is more elastic, i.e., more easily deformable, than the material of the sheath of cable 8. Sealing element 7 including its leg segments, sealing lips and yoke section is developed in integral form, in particular in one piece. A development as an injection-molded component is possible as well.

Additional cable bushings, in particular, are provided, for which the yoke section then connects the correspondingly higher number of leg segments. An appropriate number of cables is consequently routed through the recesses of the leg segments and sealed with the aid of a circumferential sealing lip in each case.

Figure 4:
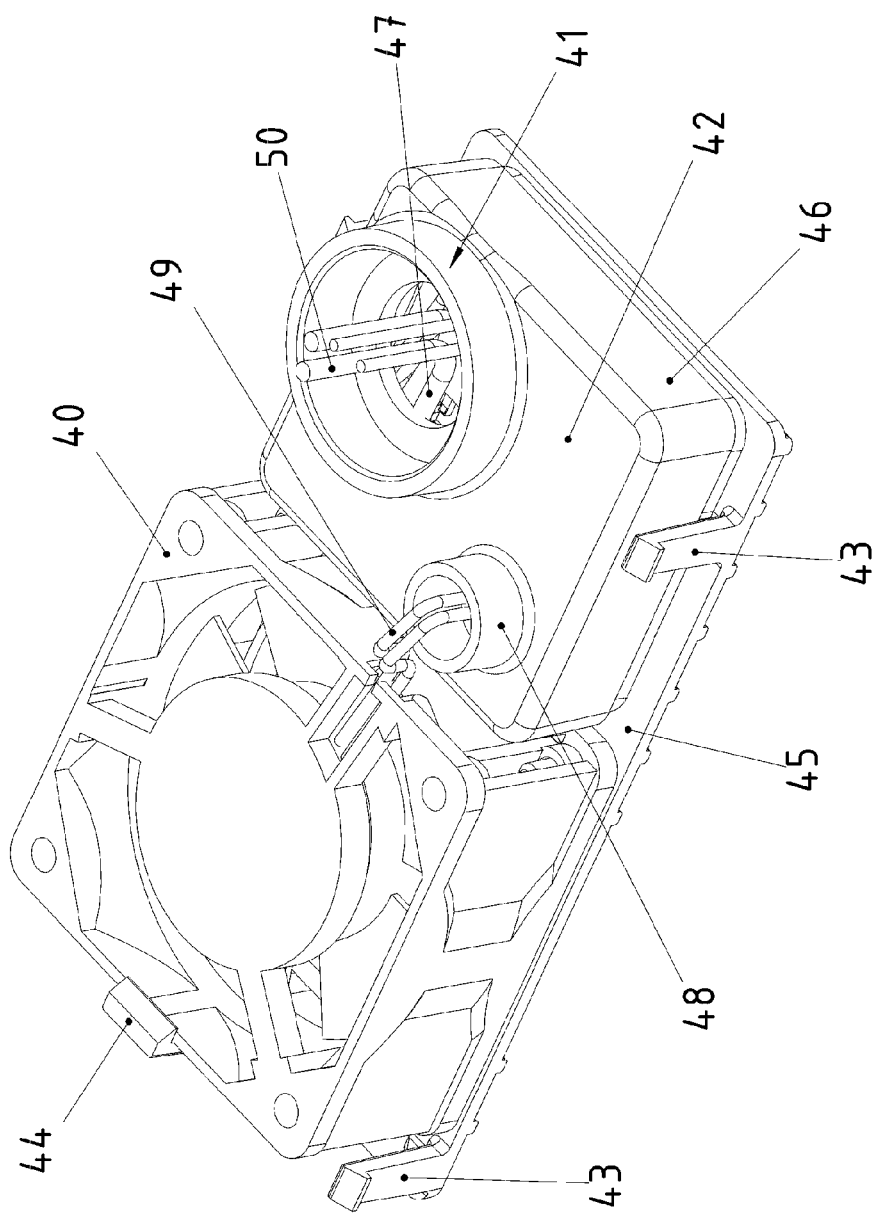
FIG. 4 shows an oblique view of a fan module, which includes a fan 40 clipped into place on a support element 45, and a sealing cap 42 having annular collar section 41.
Figure 5:
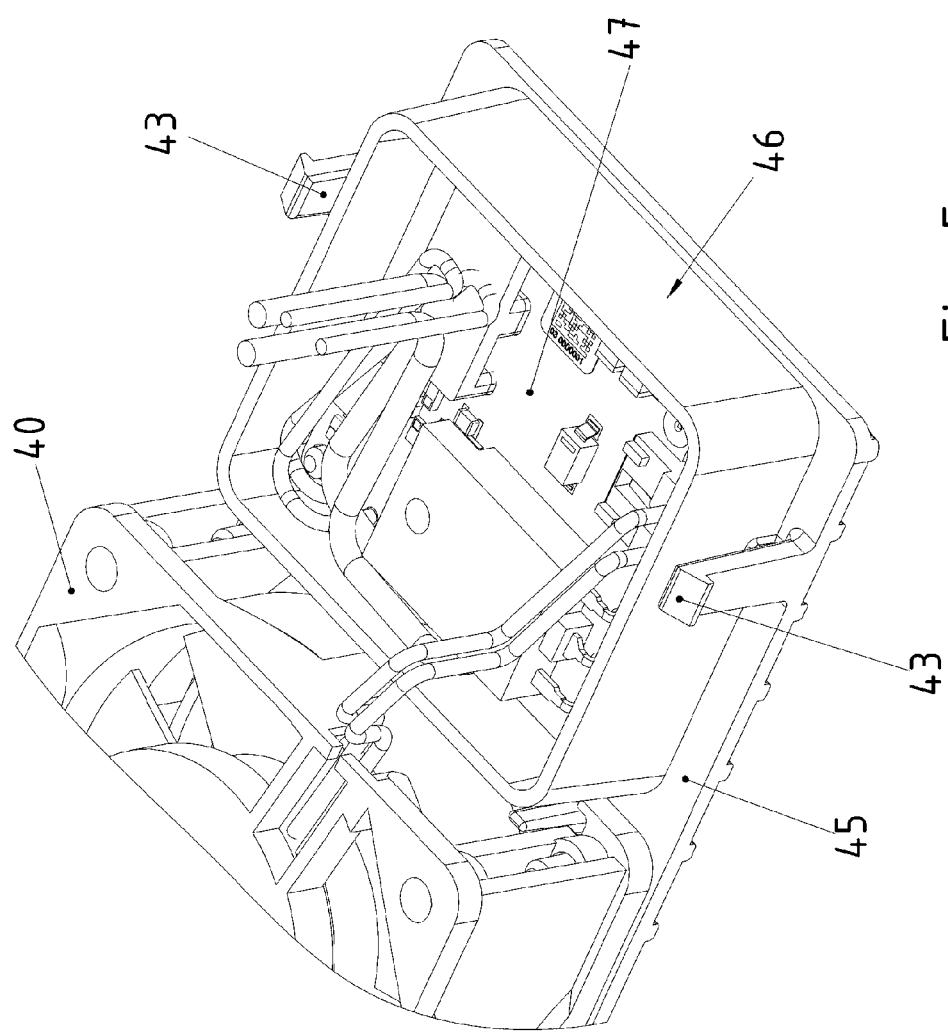
FIG. 5 shows an enlarged cut-out in connection with FIG. 4, sealing cap 42 having been removed, so that circuit board 47 including its fittings is visible.
Figure 6:
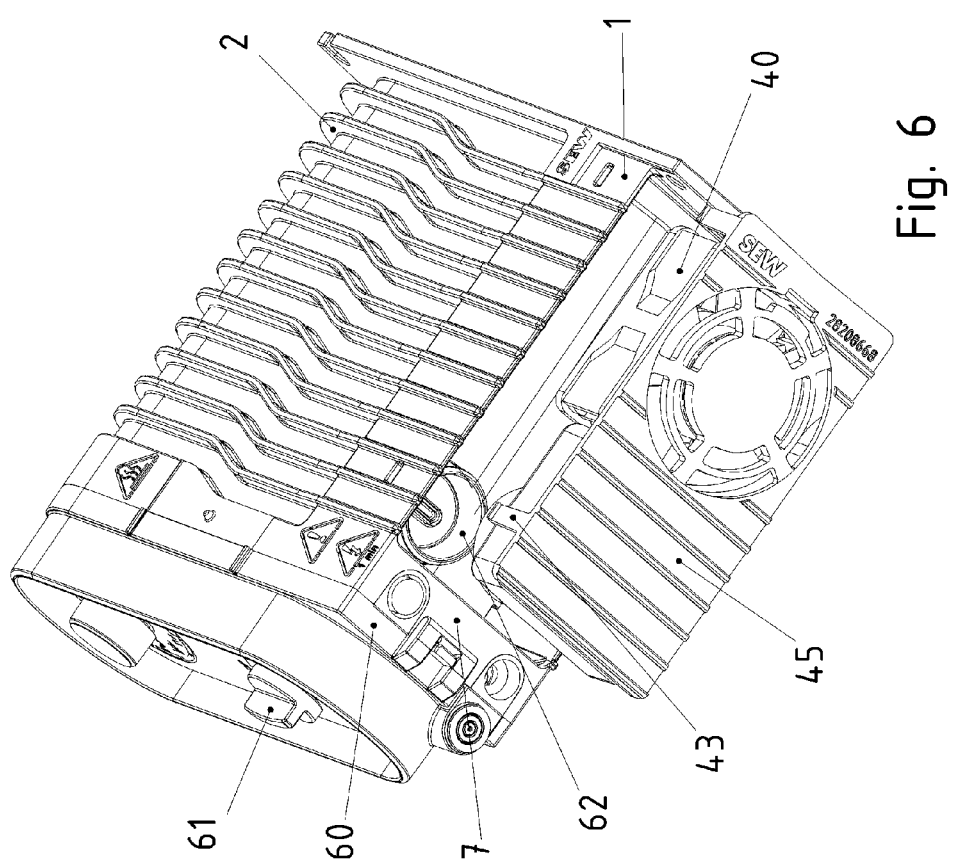
In FIG. 6 the fan module is shown at a slight distance from housing 1.
Figure 7:
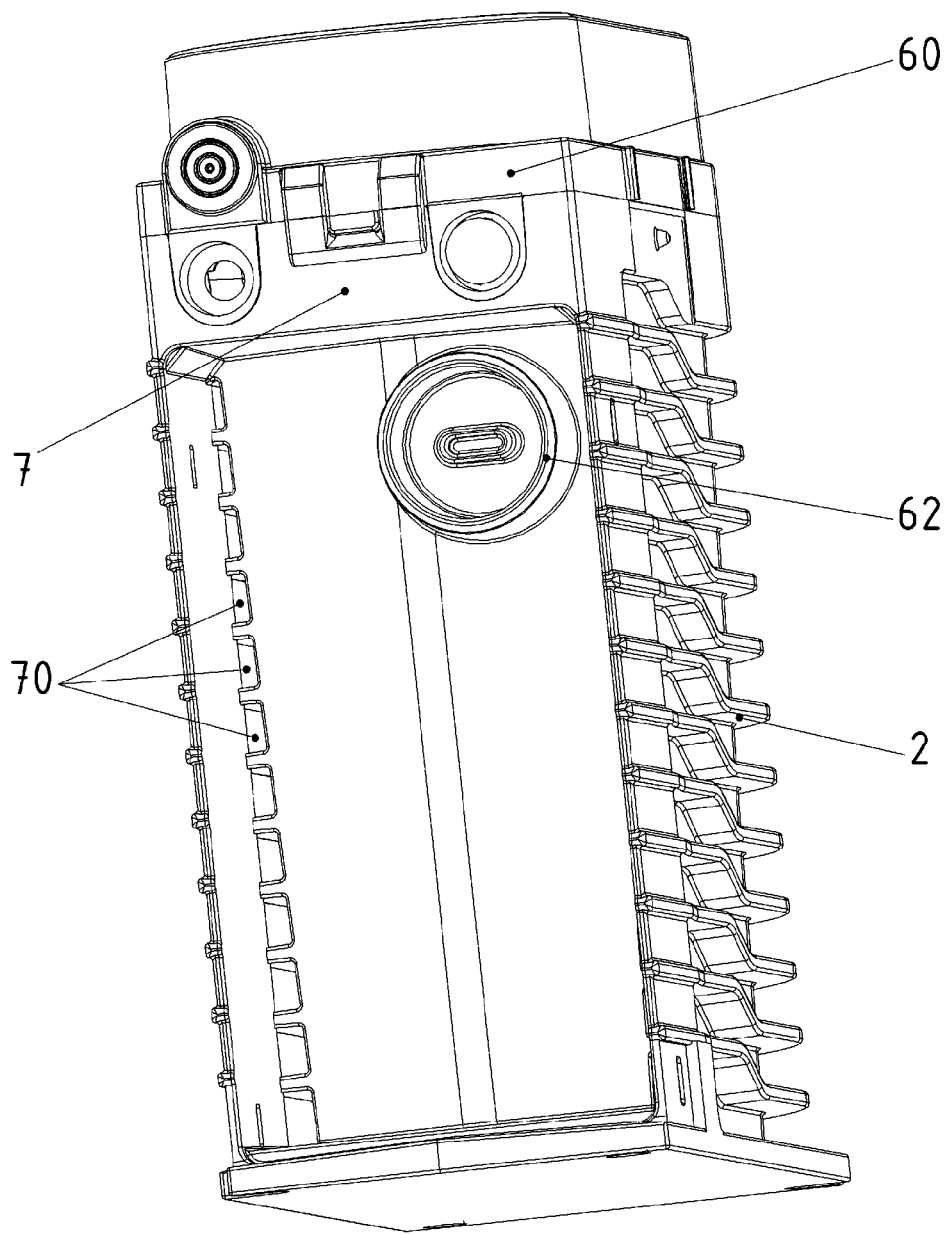
FIG. 7 shows an oblique view of housing 1 with lid 60 in place, where recesses 70 for the air discharge are visible.
Figure 8:
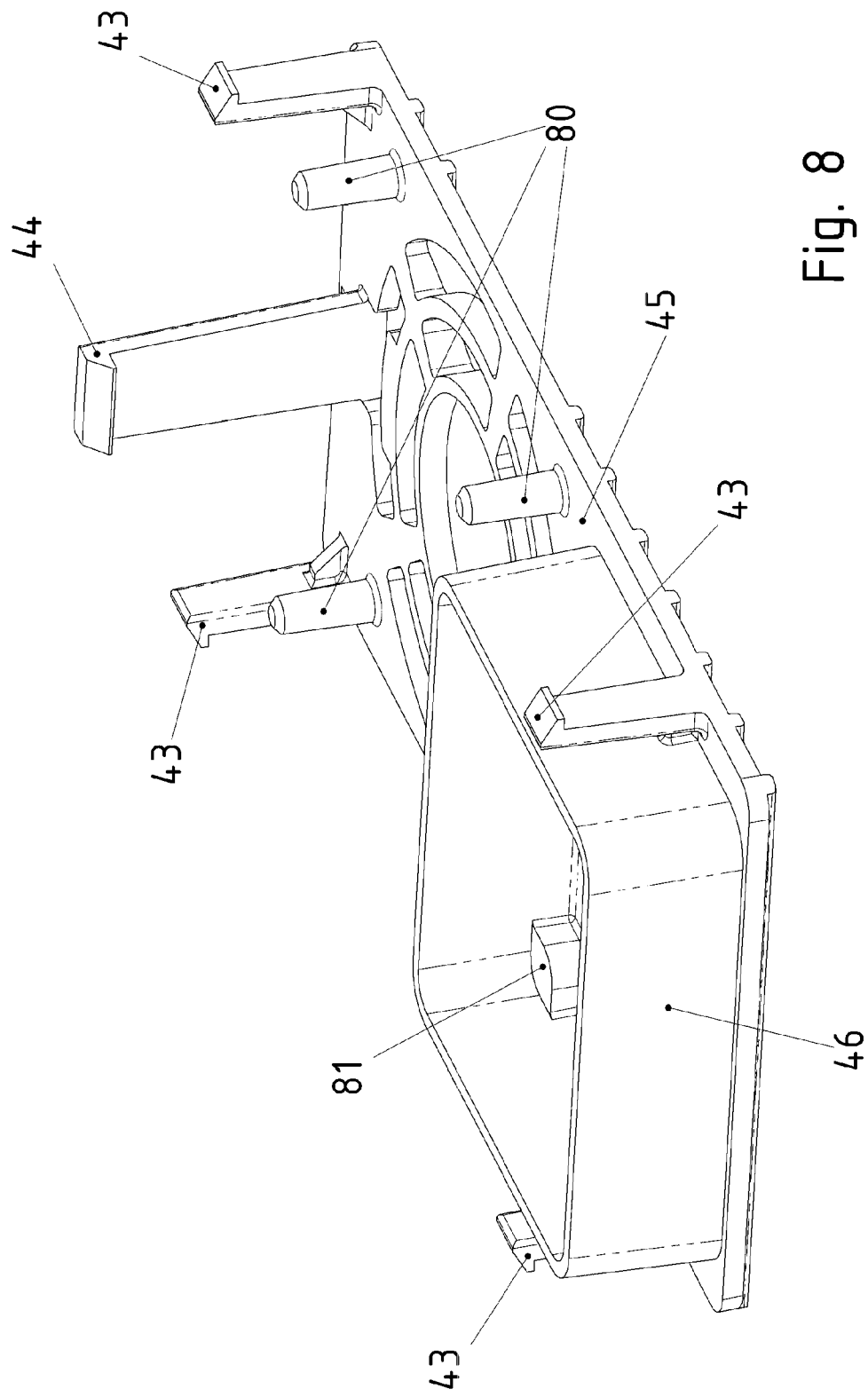
FIG. 8 shows support element 45 in an oblique view from one direction of view.
Figure 9:
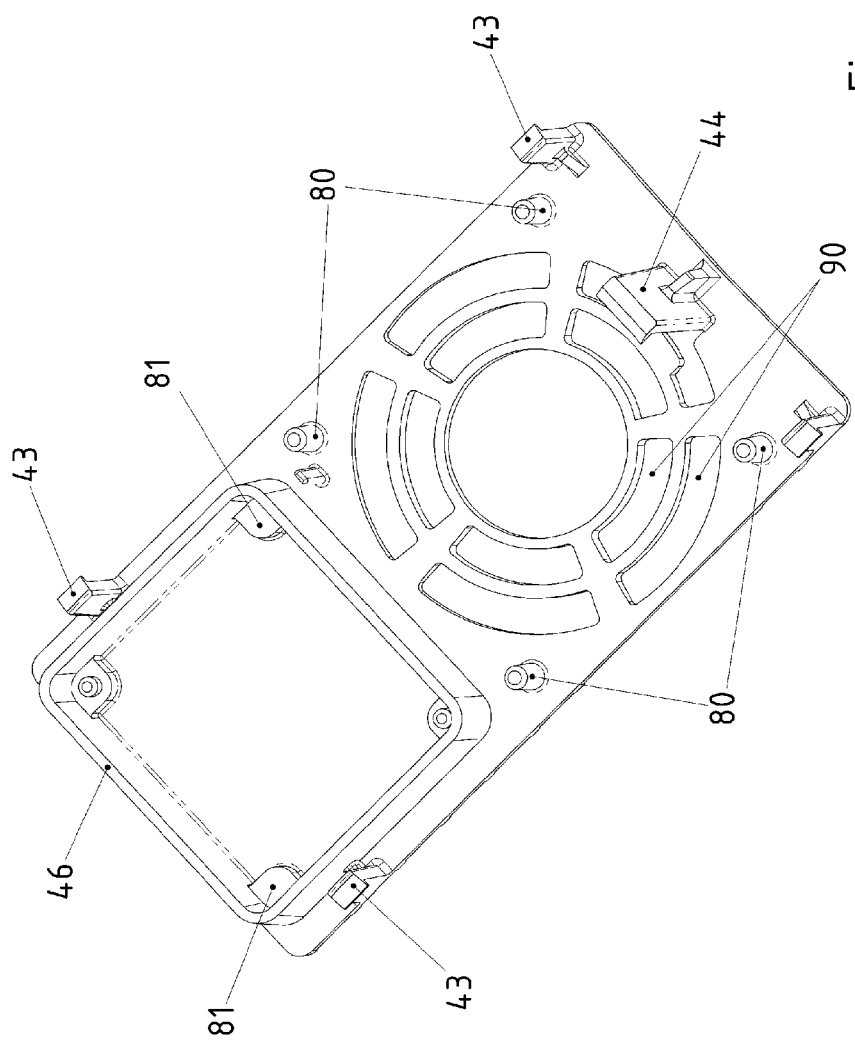
FIG. 9 shows support element 45 in an oblique view from another direction of view.
Figure 10:
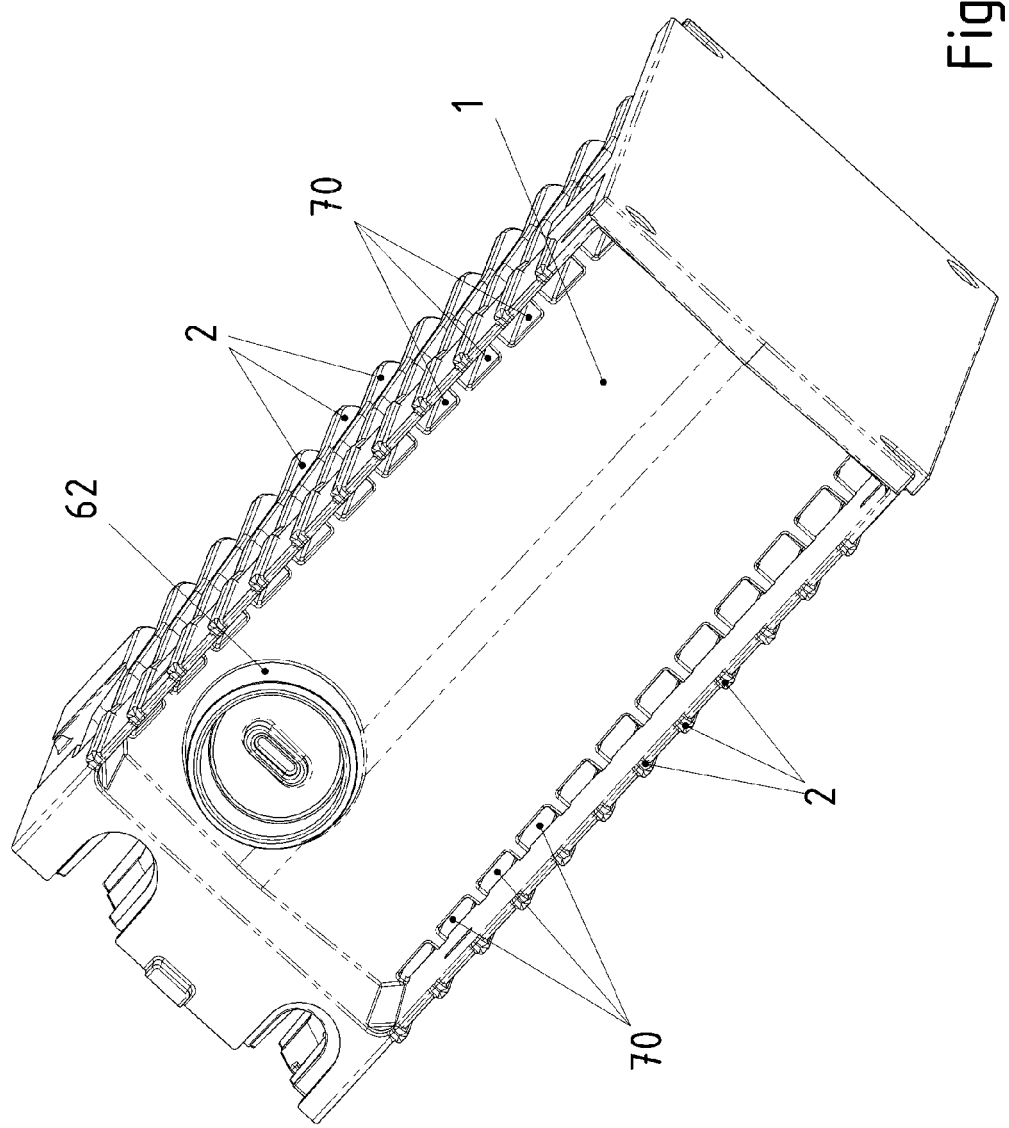
FIG. 10 shows housing 1 in an oblique view from yet another direction of view.
Figure 11:
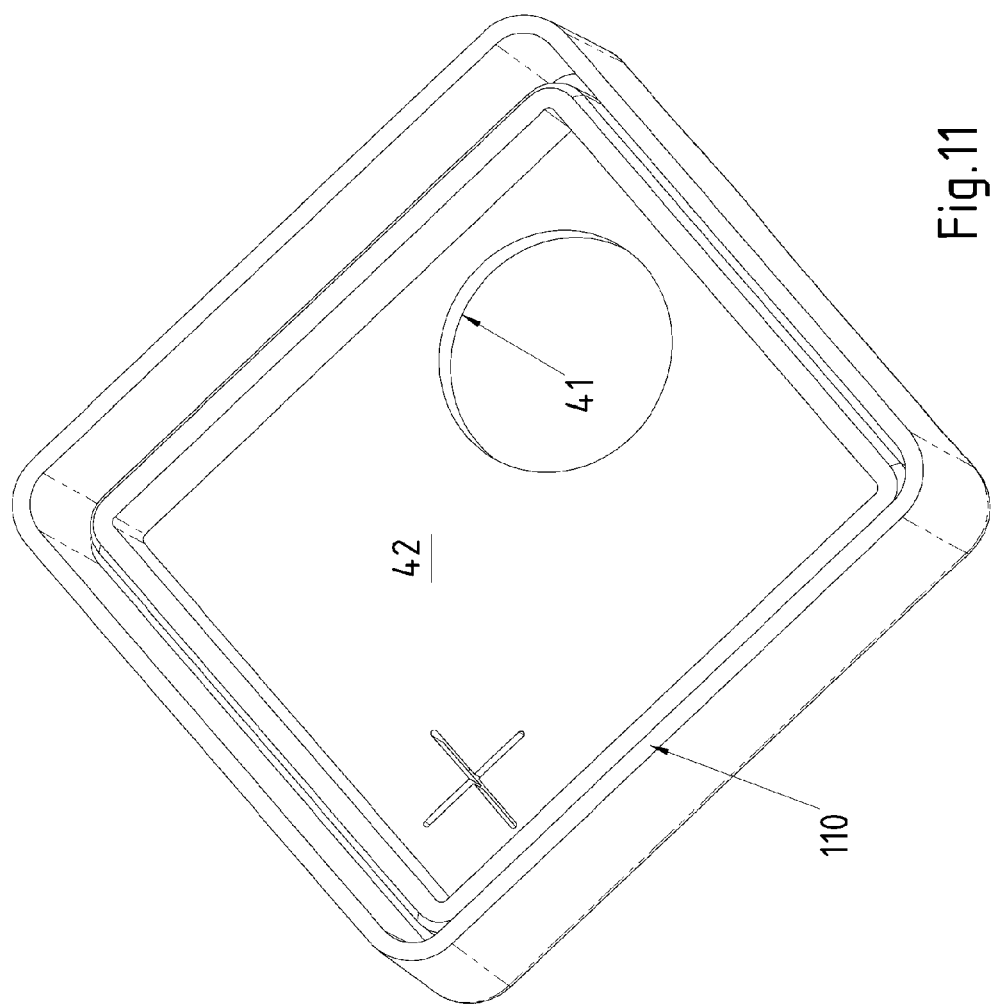
FIG. 11 shows sealing cap 42 together with its clamp-down section 110 for holding down circuit board 47.

As illustrated in FIG. 4, the fan module is formed by a carrier element, which is produced as an integral plastic-extrusion component, i.e., in one piece. This carrier element 45 has a detent, which allows fan 40 to be clipped onto carrier element 45. In addition, carrier element 45 includes detents which clip into a projection or collar section of housing 1, so that the carrier element is able to be accommodated in the depression of housing 1, visible in FIGS. 6, 7 and 10, and can thus be connected by a clip-on connection.

In addition, carrier element 45 includes a circumferential wall section 46, which at least partially surrounds a circuit board 47 fitted with electronic components, which is accommodated in the interior of the space surrounded by circumferential wall section 46 in the manner of a housing. The circuit board rests on a bearing section 81 and is preferably aligned with the aid of centering pins developed on carrier element 45.

A sealing cap 42 placed on top of circumferential wall section 46 has a circumferential clamp-down section 110 on its inner side. When sealing cap 42 is placed, this clamp-down section 110 therefore presses circuit board 47 against carrier element 45 and fixes the circuit board in position in the process.

Sealing cap 42 is likewise integrally developed, i.e., in one piece, with its clamp-down section 110 and a first annular collar section 41 as well as a further annular collar section 48, the inner diameter of further annular collar section 48 being smaller than the inner diameter of first annular collar section 41.

A supply line 49 is routed from circuit board 47 through further annular collar section 48, to fan 40. In addition, a supply line 50 is routed from the interior of housing 1 to circuit board 47 through first annular collar section 41.

When the fan module is placed in the depression of housing 1 accommodating the fan module, first annular collar section 41 is placed over a tubular section 62 of the housing. This produces a tight connection, because annular collar section 41 is resting against tubular section 62.

Carrier element 45 has a detent 43 for a connection to housing 1, in particular to a projection on housing 1.

Carrier element 45 includes a detent 44 for connecting fan 40 to carrier element 45.

Parameters of the signal electronics situated on lid 60 are provided by input means 61 disposed on the outside of lid 60.

The fan module is equipped with a fan 40, which aspirates air that flows in through recesses 90 in carrier element 45. Recesses 90 form a fan cover lattice.

The airflow supplied by fan 40 is carried to the outside through recesses 70 of the housing, the airflow being guided along cooling fins 2 developed on housing 1. For this purpose recesses 70 are appropriately formed as air deflectors into the interspace regions between the cooling fins or are provided in a step of the housing, so that they guide the airflow directly into an interspace between two cooling fins 2, or at least segments of the cooling fins, that extend parallel to one another.

Fan 40 is positioned with the aid of centering pin sections 80 formed on carrier element 45.

Carrier element 45 includes a rectangular base plate, on which circumferential wall section 46 is developed, which thus surrounds the receiving area for the fitted circuit board on the sides in the way of a housing, as well as centering pin sections 80 and the detents (43, 44).

| List of Reference Numerals | |
|---|---|
| 1 | Housing, in particular aluminum housing |
| 2 | Cooling fins |
| 3 | Leg section |
| 4 | Claw segment |
| 5 | Claw segment |
| 6 | Groove, in particular a groove having a curved design |
| 7 | Sealing element |
| 8 | Cable |
| 20 | Sealing lip, circumferential |
| 21 | Shielding |
| 22 | Insulating material |
| 23 | Core, in particular copper core |
| 24 | Groove |
| 25 | Lateral Groove |
| 30 | Yoke section |

-continued

List of Reference Numerals

| | |
|---|---|
| 40 | Fan |
| 41 | Annular collar section |
| 42 | Sealing cap |
| 43 | Detent for a connection to housing component 1 |
| 44 | Detent for connecting fan 40 to carrier element 45 |
| 45 | Carrier element |
| 46 | Wall section |
| 47 | Circuit board |
| 48 | Annular collar section |
| 49 | Supply line of fan 40 |
| 50 | Supply line of the electronics provided on circuit board 47 |
| 60 | Lid |
| 61 | Input means |
| 62 | Tubular section |
| 70 | Recesses |
| 80 | Centering pin sections |
| 81 | Seating section |
| 90 | Recesses |
| 110 | Clamp-down section |

The invention claimed is:

1. An electrical device, comprising:
a housing;
a lid placeable on the housing;
a sealing element situated in a depression of the housing, in particular the wall of the housing, which is disposed between the housing and the lid, the sealing element having a recess for the feed-through of a cable, the cable being placeable inside a curved groove of the housing, wherein the housing includes a claw segment that cuts into an electrically-conductive shield of the cable and electrically connects the shield and the housing; and
signal electronics, by which a power semiconductor switch is able to be actuated, connected to the housing in a heat-conducting manner, the signal electronics being accommodated in the lid.

2. The electrical device as recited in claim 1, wherein the curved groove is on a wall of the housing.

3. The electrical device as recited in claim 1, wherein a material of the housing includes a metal.

4. The electrical device as recited in claim 3, wherein the metal includes aluminum.

5. The electrical device as recited in claim 1, wherein, when the lid is placed on the housing, the lid presses against the sealing element in another section.

6. The electrical device as recited in claim 5, wherein the seal is a flat seal.

7. The electrical device as recited in claim 5, wherein the lid is sectionally pressed in such a way that the sealing element is pressed into the depression.

8. The electrical device as recited in claim 1, wherein:
a sealing lip of the sealing element rests against the cable.

9. The electrical device as recited in claim 8, wherein a leg segment of the sealing element includes the recess.

10. The electrical device as recited in claim 8, wherein sealing lip is a circumferential sealing lip.

11. The electrical device as recited in claim 1, wherein the curved groove extends in an S-shape.

12. The electrical device as recited in claim 1, wherein a further groove is developed in the housing, transversely to a cable direction, wherein the further groove is a lateral groove developed in the housing transversely to a groove direction of the curved groove and transversely to the cable direction, and wherein the sealing element projects into at least one of the curved groove and the lateral groove and is at least one of:
delimited in the cable direction and counter to the cable direction, and
retained inside the housing.

13. The electrical device as recited in claim 9, wherein:
a further leg segment of the sealing element includes a further recess, through which a further cable is guided,
a circumferential sealing lip of the sealing element rests against the further cable, and
the sealing element includes a yoke section, which interconnects the leg segments.

14. An electrical device, comprising:
a housing;
a lid placeable on the housing;
a sealing element situated in a depression of the housing, in particular the wall of the housing, which is disposed between the housing and the lid, the sealing element having a recess for the feed-through of a cable, the cable being placeable inside a curved groove of the housing, wherein the housing includes a claw segment that cuts into a shield of the cable; and
signal electronics, by which a power semiconductor switch is able to be actuated, connected to the housing in a heat-conducting manner, the signal electronics being accommodated in the lid;
wherein:
a sealing lip of the sealing element rests against the cable,
the cable has an electric line surrounded by an insulating material, which is enveloped by the shield,
a sheath of an electrically insulating material surrounds the shield in a region of the sealing lip of the sealing element, and
the cable is stripped of its sheath in a region of the claw segment.

15. The electrical device as recited in claim 14, wherein an inner diameter of the groove in a region of the claw segment is smaller than an outer diameter of the sheath-stripped cable.

16. The electrical device as recited in claim 1, wherein the curved groove of the housing is laterally curved with respect to a longitudinal axis of the cable.

17. The electrical device as recited in claim 1, wherein the claw segment includes a sharp edge that engages the shield.

* * * * *